United States Patent
Chae

(10) Patent No.: US 10,083,760 B2
(45) Date of Patent: Sep. 25, 2018

(54) SEMICONDUCTOR DEVICES AND SEMICONDUCTOR SYSTEMS INCLUDING THE SAME

(71) Applicant: SK hynix Inc., Icheon-si Gyeonggi-do (KR)

(72) Inventor: Haeng Seon Chae, Yongin-si (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 266 days.

(21) Appl. No.: 14/927,076

(22) Filed: Oct. 29, 2015

(65) Prior Publication Data

US 2017/0018314 A1 Jan. 19, 2017

(30) Foreign Application Priority Data

Jul. 13, 2015 (KR) .................. 10-2015-0098956

(51) Int. Cl.
*G11C 29/38* (2006.01)
*G11C 29/44* (2006.01)
*G11C 29/50* (2006.01)

(52) U.S. Cl.
CPC ............. *G11C 29/38* (2013.01); *G11C 29/44* (2013.01); *G11C 29/4401* (2013.01)

(58) Field of Classification Search
CPC ..... G11C 29/38; G11C 29/44; G11C 29/4401; G11C 29/52; G11C 2029/4402
See application file for complete search history.

(56) References Cited

U.S. PATENT DOCUMENTS

| 4,064,557 | A | * | 12/1977 | Bluethman | ............... G06F 3/09 358/1.16 |
| 5,015,886 | A | * | 5/1991 | Choi | ................ G01R 31/31701 326/105 |
| 5,182,597 | A | * | 1/1993 | Masuda | ................. G03G 15/30 340/675 |
| 6,347,064 | B1 | * | 2/2002 | Seo | ...................... G11C 7/1006 365/189.04 |
| 2005/0028058 | A1 | * | 2/2005 | Perner | ................ G11C 29/1201 714/718 |
| 2007/0115037 | A1 | * | 5/2007 | Yokosawa | ............ H03K 3/0231 327/172 |
| 2008/0101468 | A1 | * | 5/2008 | Ishikawa | .............. H04N 17/045 375/240.12 |
| 2009/0063913 | A1 | | 3/2009 | Yamasaki et al. | |
| 2009/0210187 | A1 | * | 8/2009 | Lee | .................... G01R 31/3177 702/108 |

(Continued)

FOREIGN PATENT DOCUMENTS

KR 1020080029241 A 4/2008

*Primary Examiner* — April Y Blair
*Assistant Examiner* — Dipakkumar Gandhi
(74) *Attorney, Agent, or Firm* — William Park & Associates Ltd.

(57) ABSTRACT

A semiconductor system may include a first semiconductor device and a second semiconductor device. The first semiconductor device may be configured to output command signals and setting signals. The second semiconductor device may be configured to decode the command signals, extract setting codes from the setting signals, and test a memory cell array accessed by address patterns during at least one operation section corresponding to the setting codes to confirm whether the memory cell array includes at least one failed memory cell.

19 Claims, 7 Drawing Sheets

(56) References Cited

U.S. PATENT DOCUMENTS

2010/0005350 A1* 1/2010 Kim ................ G11C 29/46
                                                714/718
2015/0243374 A1* 8/2015 Sohn ................ G06F 11/27
                                                 365/96

* cited by examiner

SEMICONDUCTOR DEVICES AND SEMICONDUCTOR SYSTEMS INCLUDING THE SAME

CROSS-REFERENCE TO RELATED APPLICATIONS

The present application claims priority under 35 U.S.C 119(a) to Korean Patent Application No. 10-2015-0098956, filed on Jul. 13, 2015, in the Korean Intellectual Property Office, which is incorporated herein by reference in its entirety as set forth in full.

BACKGROUND

1. Technical Field

Embodiments of the present disclosure generally relate to semiconductor devices and semiconductor systems, and, more particularly to semiconductor devices executing a test operation and semiconductor systems including the same.

2. Related Art

Recently, as design schemes and manufacturing processes of semiconductor devices become more complicated, procedures for testing the semiconductor devices have become more complicated and difficult. In addition, the semiconductor devices have become more highly integrated. Accordingly, testing times of the semiconductor devices have increased.

In order to cut the test cost with reduction of the test time, a method for testing the semiconductor devices during evaluation of the reliability of the semiconductor devices has been developed. As a typical example, a test during burn-in (hereinafter, referred to as TDBI) process performed after packaging the semiconductor devices has been proposed to reduce the test time. According to the TDBI process, a write operation of a semiconductor device encapsulated in a package form may be repeatedly executed with a simple test pattern to apply stress to the semiconductor device and a test for discriminating whether the semiconductor device normally operates or not may be executed. Specifically, during the TDBI process, the stress may be applied to the semiconductor device by repeatedly executing the write operation with a simple test pattern for a long time (e.g., a few hours maximally) at a relatively high temperature (e.g., about 100° C. maximally) with a relatively high power supply voltage.

In order to efficiently test semiconductor devices before packaging the semiconductor devices, a method for incorporating a built-in self-test (hereinafter, referred to as BIST) circuit into the semiconductor devices has been proposed. In addition, a design scheme for incorporating a built-in self-repair (hereinafter, referred to as BISR) circuit into the semiconductor devices has been proposed to increase yield of the semiconductor devices, and the design scheme has been widely used to repair defects detected by a wafer level burn-in (WBI) test. Here, the BISR circuit of the semiconductor devices may include the BIST circuit, a built-in self-diagnostics (BISD) circuit, a built-in redundancy analysis (BIRA) circuit, or the like.

SUMMARY

According to an embodiment, a semiconductor system may be provided. The semiconductor system may include a first semiconductor device and a second semiconductor device. The first semiconductor device may be configured to output command signals and setting signals. The second semiconductor device may be configured to decode the command signals. The second semiconductor device may be configured to extract setting codes from the setting signals. The second semiconductor device may be configured to test a memory cell array accessed by address patterns during at least one operation section corresponding to the setting codes to confirm whether the memory cell array includes at least one failed memory cell.

According to an embodiment, a semiconductor system may be provided. The semiconductor system may include a first semiconductor device and a second semiconductor device. The first semiconductor device may be configured to output command signals. The second semiconductor device may be configured to decode the command signals. The second semiconductor device may be configured to generate setting codes. The second semiconductor device may be configured to test a memory cell array accessed by address patterns during at least one operation section corresponding to the setting codes to confirm whether the memory cell array includes at least one failed memory cell.

According to an embodiment, a semiconductor device may be provided. The semiconductor device may include a command flag generation circuit and a test circuit. The command flag generation circuit may be configured to generate a first command flag which is enabled during a first operation section corresponding to a second setting code from a point of time that a start section corresponding to a first setting code terminates. The command flag generation circuit may be configured to generate a second command flag which is enabled during a second operation section corresponding to a third setting code from a point of time that the first operation section terminates. The command flag generation circuit may be configured to generate a third command flag which is enabled during a third operation section corresponding to a fourth setting code from a point of time that the second operation section terminates. The test circuit may be configured to generate and store pass/fail information using a write operation for writing data patterns into a memory cell array accessed by row address patterns and column address patterns generated in response to a test start signal and a read operation for reading data stored in the memory cell array.

DETAILED DESCRIPTION

Various embodiments of the present disclosure will be described hereinafter with reference to the accompanying drawings. However, the embodiments described herein are for illustrative purposes only and are not intended to limit the scope of the present disclosure.

Various embodiments may be directed to semiconductor devices and semiconductor systems including the same.

Figure 1:
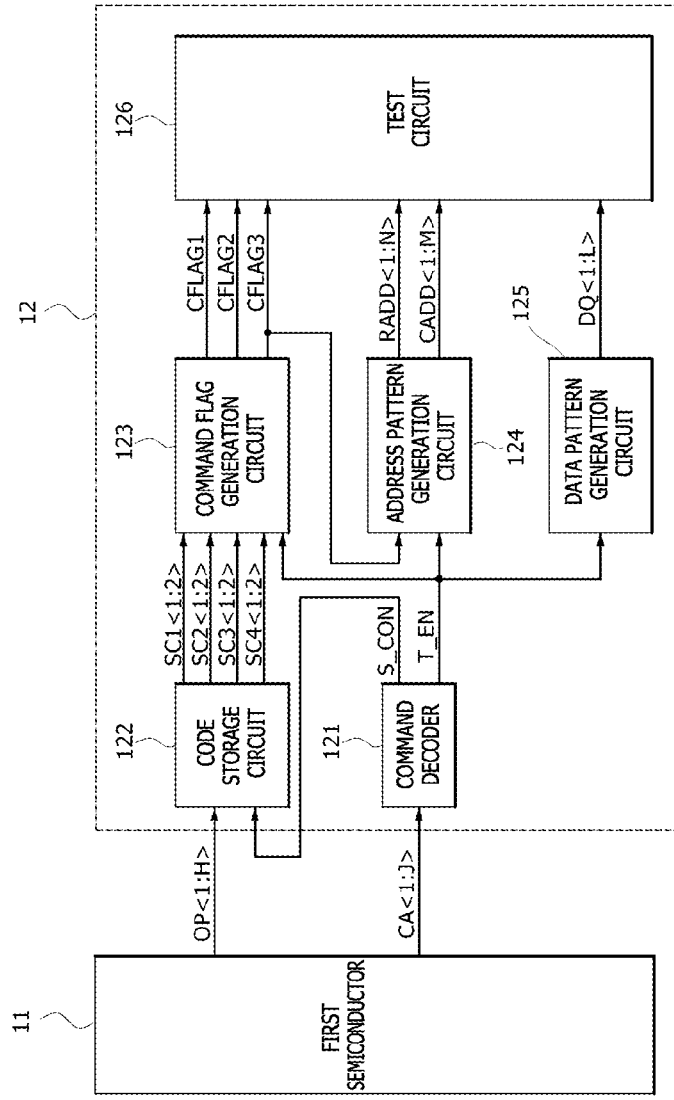
FIG. 1 is a block diagram illustrating a representation of an example of a configuration of a semiconductor system according to an embodiment.

Referring to FIG. 1, a semiconductor system according to an embodiment may include a first semiconductor device 11 and a second semiconductor device 12. The second semiconductor device 12 may include a command decoder 121, a code storage circuit 122, a command flag generation circuit 123, an address pattern generation circuit 124, a data pattern generation circuit 125, and a test circuit 126.

The first semiconductor device 11 may output command signals CA<1:J> (i.e., J may be an integer greater than 1) and setting signals OP<1:H> (i.e., H may be an integer greater than 1). The command signals CA<1:J> may be set to have various logic level combinations. A test start signal T_EN or a storage control signal S_CON may be enabled according to a logic level combination of the command signals CA<1:J>. The command signals CA<1:J> may be transmitted through command lines via which only commands are transferred or through command/address lines via which both of commands and addresses are transferred. The number of bits included in the command signals CA<1:J> may be set to be different according to the embodiments. The setting signals OP<1:H> may include information for setting a first setting code SC1<1:2>, a second setting code SC2<1:2>, a third setting code SC3<1:2> and a fourth setting code SC4<1:2>. The information on the first to fourth setting codes SC1<1:2>, SC2<1:2>, SC3<1:2> and SC4<1:2> may be included in the setting signals OP<1:H> and may be simultaneously outputted from the first semiconductor device 11 at a time. Alternatively, the information on the first to fourth setting codes SC1<1:2>, SC2<1:2>, SC3<1:2> and SC4<1:2> may be included in the setting signals OP<1:H> and may be sequentially outputted from the first semiconductor device 11 according to the embodiments. The number of bits included in the setting signals OP<1:H> may be set to be different according to the embodiments. The setting signals OP<1:H> may be may be transmitted through signal lines via which commands and/or data are transferred. Although FIG. 1 illustrates an example in which the command signals CA<1:J> and the setting signals OP<1:H> are transmitted through separate signal lines, the present disclosure is not limited thereto. For example, the command signals CA<1:J> and the setting signals OP<1:H> may be transmitted through the same signal line according to the embodiments. The number of bits of each of the first to fourth setting codes SC1<1:2>, SC2<1:2>, SC3<1:2> and SC4<1:2> may be set to be a single bit or at least three bits.

The command decoder 121 may decode the command signals CA<1:J> to generate the test start signal T_EN and the storage control signal S_CON. The test start signal T_EN may be enabled if the command signals CA<1:J> have a first logic level combination, and the storage control signal S_CON may be enabled if the command signals CA<1:J> have a second logic level combination. If the test start signal T_EN is enabled, a test may be executed to confirm whether memory cells in a memory cell array normally operate and to repair the memory cell array when the memory cell array includes at least one failed memory cell. If the storage control signal S_CON is enabled, the information on the first to fourth setting codes SC1<1:2>, SC2<1:2>, SC3<1:2> and SC4<1:2> may be extracted from the setting signals OP<1:H> and may be stored in the code storage circuit 122. Design schemes for enabling the test start signal T_EN and the storage control signal S_CON may be realized to be different according to the embodiments. For example, the test start signal T_EN and the storage control signal S_CON may be generated to have a predetermined logic level or to include a pulse at a point of time that the test start signal T_EN and the storage control signal S_CON are enabled. The first and second logic level combinations may be set to be different according to the embodiments. The command decoder 121 may be realized to generate the test start signal T_EN which is enabled after the storage control signal S_CON is enabled. In such an example, the memory cell array may be evaluated and repaired after the information on the first to fourth setting codes SC1<1:2>, SC2<1:2>, SC3<1:2> and SC4<1:2> is extracted from the setting signals OP<1:H> and stored in the code storage circuit 122. In some embodiments, the command decoder 121 may be realized to generate the storage control signal S_CON which is enabled after the test start signal T_EN is enabled. In such an example, after a test for evaluating and repairing the memory cell array commences, the storage control signal S_CON may be enabled to extract the information on the first to fourth setting codes SC1<1:2>, SC2<1:2>, SC3<1:2> and SC4<1:2> from the setting signals OP<1:H> and store the information in the code storage circuit 122.

The code storage circuit 122 may extract the information on the first to fourth setting codes SC1<1:2>, SC2<1:2>, SC3<1:2> and SC4<1:2> from the setting signals OP<1:H> and may store the information therein, in response to the storage control signal S_CON. For example, if the storage control signal S_CON is enabled, the code storage circuit 122 may extract the first to fourth setting codes SC1<1:2>, SC2<1:2>, SC3<1:2> and SC4<1:2> from the setting signals OP<1:H> and may store the first to fourth setting codes SC1<1:2>, SC2<1:2>, SC3<1:2> and SC4<1:2> therein. For example, the code storage circuit 122 may extract the first to fourth setting codes SC1<1:2>, SC2<1:2>, SC3<1:2> and SC4<1:2> which are simultaneously inputted by the setting signals OP<1:H> and may store the first to fourth setting codes SC1<1:2>, SC2<1:2>, SC3<1:2> and SC4<1:2> therein, in synchronization with the storage control signal S_CON which is enabled. Alternatively, in some other embodiments, the code storage circuit 122 may extract the first to fourth setting codes SC1<1:2>, SC2<1:2>, SC3<1:2> and SC4<1:2> which are sequentially inputted by the setting signals OP<1:H> and may store the first to fourth setting codes SC1<1:2>, SC2<1:2>, SC3<1:2> and SC4<1:2> therein, in synchronization with the storage control signal S_CON which is enabled. The code storage circuit 122 may output the first to fourth setting codes SC1<1:2>, SC2<1:2>, SC3<1:2> and SC4<1:2> which are stored therein. A point of time that the code storage circuit 122 outputs the first to fourth setting codes SC1<1:2>, SC2<1:2>, SC3<1:2> and SC4<1:2> may be set by a signal which is generated by delaying the storage control signal S_CON. In some embodiments, the first to fourth setting codes SC1<1:2>, SC2<1:2>, SC3<1:2> and SC4<1:2> may be outputted from the code storage circuit 122 in synchronization with a point of time that the first to fourth setting codes SC1<1:2>, SC2<1:2>, SC3<1:2> and SC4<1:2> are stored in the code storage circuit 122. The number of bits of each of the first to fourth setting codes SC1<1:2>, SC2<1:2>, SC3<1:2> and SC4<1:2> may be set to be different according to the embodiments.

The command flag generation circuit 123 may generate first to third command flags CFLAG1, CFLAG2 and CFLAG3 from the first to fourth setting codes SC1<1:2>, SC2<1:2>, SC3<1:2> and SC4<1:2> in response to the test start signal T_EN. The command flag generation circuit 123 may commence to generate the first to third command flags CFLAG1, CFLAG2 and CFLAG3 in synchronization with a point of time that a start section set by the first setting code SC1<1:2> elapses from a point of time that the test start signal T_EN is enabled. The command flag generation circuit 123 may generate the first command flag CFLAG1 which is enabled during a first operation section that is set according to the second setting code SC2<1:2>. The command flag generation circuit 123 may generate the second command flag CFLAG2 which is enabled during a second operation section that is set according to the third setting code SC3<1:2>. The command flag generation circuit 123 may generate the third command flag CFLAG3 which is enabled during a third operation section that is set according to the fourth setting code SC4<1:2>. The start section, the first operation section, the second operation section and the third operation section may be set to be different by logic level combinations of the first to fourth setting codes SC1<1:2>, SC2<1:2>, SC3<1:2> and SC4<1:2> according to the embodiments. For example, if the first, second, third and fourth setting codes SC1<1:2>, SC2<1:2>, SC3<1:2> and SC4<1:2> respectively have logic level combinations of '10', '11', '11' and '01', the start section, the first operation section, the second operation section and the third operation section may be respectively twice a unit section, three times the unit section, three times the unit section and the unit section. A fact that the first setting code SC1<1:2> has a logic level combination of '10' means that a first bit (SC1<1>) of the first setting code SC1<1:2> has a logic "low" level and a second bit (SC1<2>) of the first setting code SC1<1:2> has a logic "high" level. The unit section may be set to be different according to the embodiments. In some embodiments, the unit section may correspond to a cycle of the clock signal CLK. Various operations such as a read operation, a write operation, a refresh operation, a pre-charge operation, a mode register set operation, a pass/fail information storage operation and a repair operation may be executed in the first operation section, the second operation section and the third operation section. For example, the write operation may be executed in the first operation section, the read operation may be executed in the second operation section, and the pass/fail information storage operation may be executed in the third operation section. The command flag generation circuit 123 may circularly generate the first, second and third command flags CFLAG1, CFLAG2 and CFLAG3 from the second, third and fourth setting codes SC2<1:2>, SC3<1:2> and SC4<1:2>. That is, the first, second and third operation sections may be sequentially and repeatedly generated after the start section. In the present embodiment, each of the first to fourth setting codes SC1<1:2>, SC2<1:2>, SC3<1:2> and SC4<1:2> may be set to have two bits, and the start section, the first operation section, the second operation section and the third operation section may be set to have the unit section, twice the unit section and three times the unit section. However, in some embodiments, each of the first to fourth setting codes SC1<1:2>, SC2<1:2>, SC3<1:2> and SC4<1:2> may be set to have N-number of bits (wherein, "N" denotes a natural number). In such an example, the start section, the first operation section, the second operation section and the third operation section may be set to have the unit section, twice the unit section, . . . and ($2^N$-1) times the unit section. A configuration and an operation of the command flag generation circuit 123 will be described below with reference to FIGS. 2 and 3 later.

The address pattern generation circuit 124 may generate row address patterns RADD<1:N> and column address patterns CADD<1:M> in response to the test start signal T_EN and the third command flag CFLAG3. For example, if the test start signal T_EN is enabled to test the second semiconductor device 12, the address pattern generation circuit 124 may generate the row address patterns RADD<1:N> (i.e., N may be an integer greater than 1) and the column address patterns CADD<1:M> (i.e., M may be an integer greater than 1) for operations executed in the first and second operation sections. In such an example, logic level combinations of the row address patterns RADD<1:N> and the column address patterns CADD<1:M> may be set to access a predetermined memory cell or a predetermined memory cell array. The predetermined memory cell or the predetermined memory cell array accessed by the logic level combinations of the row address patterns RADD<1:N> and the column address patterns CADD<1:M> may be set to be different according to the embodiments. The number of bits of the row address patterns RADD<1:N> and the number of bits of the column address patterns CADD<1:M> may be set to be different according to the embodiments. If an operation executed in the third operation section terminates, the address pattern generation circuit 124 may change the logic level combinations of the row address patterns RADD<1:N> and the column address patterns CADD<1:M> in synchronization with the third command flag CFLAG3 which is disabled. Thus, the memory cell or the memory cell array accessed during the first and second operation sections may be different from the memory cell or the memory cell array accessed during the previous first and second operation sections. For example, if a pass/fail information storage operation of a first memory cell array terminates in the third operation section after a write operation of the first memory cell array is executed in the first operation section and a read operation of the first memory cell array is executed in the second operation section, the write operation, the read operation and the pass/fail information storage operation of a second memory cell array may be sequentially executed after the pass/fail information storage operation of the first memory cell array terminates. In such an example, locations of the first and second memory cell arrays may be set to be different according to the embodiments. A test including the write operation, the read operation and the pass/fail information storage operation may be repeatedly performed to evaluate and repair all of the memory cell arrays included in the second semiconductor device 12. Alternatively, the test may be performed to selectively evaluate and repair only one or some of the memory cell arrays included in the second semiconductor device 12 according to the embodiments.

The data pattern generation circuit 125 may generate data patterns DQ<1:L> (i.e., L may be an integer greater than 1) in response to the test start signal T_EN. For example, if the test start signal T_EN is enabled to test the second semiconductor device 12, the data pattern generation circuit 125 may generate the data patterns DQ<1:L>. A logic level combination of the data patterns DQ<1:L> and the number of bits of the data patterns DQ<1:L> may be set to be different according to the embodiments. In some embodiments, the data patterns DQ<1:L> may be set to be a signal having a single bit. In the event that a pass/fail information storage operation of a memory cell array is executed in the third operation section after a write operation of the memory cell array is executed in the first operation section and a read operation of the memory cell array is executed in the second operation section, the data patterns DQ<1:L> may be written into the memory cell array during the write operation and the data patterns DQ<1:L> written into the memory cell array may be read out during the read operation to verify whether the memory cell array includes at least one failed memory cell.

The test circuit 126 may perform a test operation in response to the first command flag CFLAG1, the second command flag CFLAG2, the third command flag CFLAG3, the row address patterns RADD<1:N>, the column address patterns CADD<1:M> and the data patterns DQ<1:L>. The test operation executed by test circuit 126 will be described hereinafter.

The test circuit 126 may perform an operation for writing the data patterns DQ<1:L> into a first memory cell array accessed by the row address patterns RADD<1:N> and the column address patterns CADD<1:M> during the first operation section in which the first command flag CFLAG1 is enabled. The test circuit 126 may perform an operation for reading out the data stored in the first memory cell array accessed by the row address patterns RADD<1:N> and the column address patterns CADD<1:M> during the second operation section in which the second command flag CFLAG2 is enabled. In such an example, the test circuit 126 may confirm whether the data read out of the first memory cell array are consistent with the data patterns DQ<1:L> to generate the pass/fail information on the first memory cell array. In some embodiments, a compression parallel test may be used to confirm whether the data read out of the first memory cell array are consistent with the data patterns DQ<1:L>. According to the compression parallel test, data having a logic "high" level may be written into all of memory cells included in the first memory cell array and fail information may be generated if at least one datum having a logic "low" level is read out of the first memory cell array. The test circuit 126 may perform an operation for storing the pass/fail information on the first memory cell array therein during the third operation section in which the third command flag CFLAG3 is enabled. If the test operation of the first memory cell array terminates, the other memory cell arrays included in the second semiconductor device 12 may be sequentially tested to generate the pass/fail information on the other memory cell arrays. A configuration and an operation of the test circuit 126 will be described below with reference to FIG. 4 later.

Figure 2:
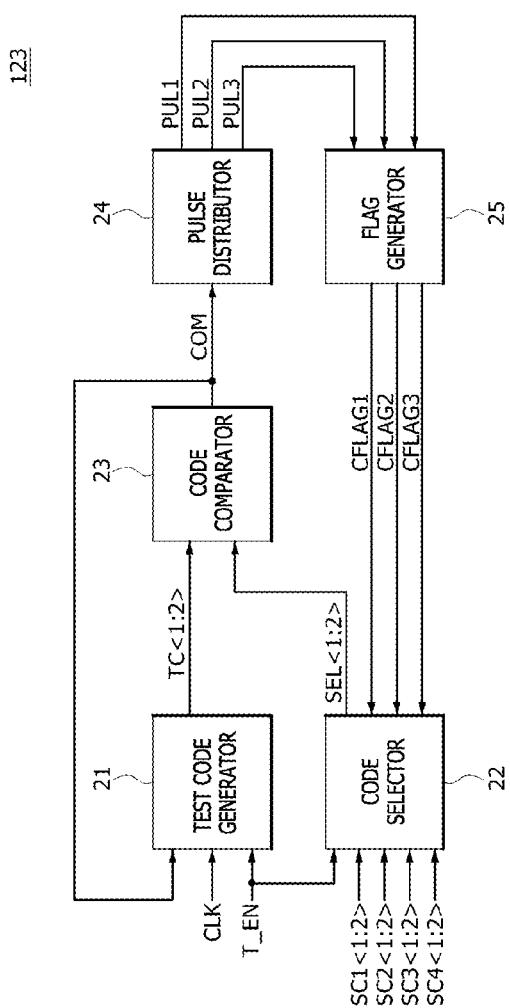
FIG. 2 is a block diagram illustrating a representation of an example of a configuration of a command flag generation circuit included in the semiconductor system of FIG. 1.

Referring to FIG. 2, the command flag generation circuit 123 may include a test code generator 21, a code selector 22, a code comparator 23, a pulse distributor 24 and a flag generator 25.

The test code generator 21 may generate test codes TC<1:2> in response to the test start signal T_EN, a clock signal CLK and a comparison signal COM. For example, the test code generator 21 may generate the test codes TC<1:2> that are counted in synchronization with the clock signal CLK if the test start signal T_EN is enabled to test the second semiconductor device 12. The test code generator 21 may be configured to include a counter that counts up or counts down the test codes TC<1:2>. For example, the test code generator 21 may generate the test codes TC<1:2> that are counted up bit by bit to have logic level combinations of '00', '01', '10' and '11' in sequence if the test start signal T_EN is enabled to test the second semiconductor device 12.

A fact that the test codes TC<1:2> have a logic level combination of '01' means that a first bit (TC<1>) of the test codes TC<1:2> has a logic "high" level and a second bit (TC<2>) of the test codes TC<1:2> has a logic "low" level. The test code generator 21 may initialize the test codes TC<1:2> to a logic level combination of '00' if a pulse of the comparison signal COM is inputted thereto. The test code generator 21 may count up the initialized test codes TC<1:2> bit by bit in synchronization with the clock signal CLK so that test codes TC<1:2> have logic level combinations of '00', '01', '10' and '11' in sequence.

The code selector 22 may select and output one of the first to fourth setting codes SC1<1:2>, SC2<1:2>, SC3<1:2> and SC4<1:2> as a selection code SEL<1:2> in response to the test start signal T_EN and the first to third command flags CFLAG1, CFLAG2 and CFLAG3. An operation of the code selector 22 will be described in below. The code selector 22 may select and output the first setting code SC1<1:2> as the selection code SEL<1:2> if the test start signal T_EN is enabled to test the second semiconductor device 12. The code selector 22 may select and output the second setting code SC2<1:2> as the selection code SEL<1:2> if the first command flag CFLAG1 is enabled. The code selector 22 may select and output the third setting code SC3<1:2> as the selection code SEL<1:2> if the second command flag CFLAG2 is enabled. The code selector 22 may select and output the fourth setting code SC4<1:2> as the selection code SEL<1:2> if the third command flag CFLAG3 is enabled. A design scheme for selecting and outputting one of the second, third and fourth setting codes SC2<1:2>, SC3<1:2> and SC4<1:2> as the selection code SEL<1:2> may be realized to be different according to the embodiments.

The code comparator 23 may compare the selection code SEL<1:2> with the test code TC<1:2> to generate the comparison signal COM. For example, the code comparator 23 may generate a pulse of the comparison signal COM if the selection code SEL<1:2> has the same logic level combination as the test code TC<1:2>. A pulse width of the comparison signal COM may be set to be deferent according to the embodiments.

The pulse distributor 24 may receive the comparison signal COM to generate first to third pulse signals PUL1, PUL2 and PUL3. For example, the pulse distributor 24 may sequentially output the pulses of the comparison signal COM as the first, second and third pulse signals PUL1, PUL2 and PUL3. For example, the pulse distributor 24 may output the first pulse of the comparison signal COM as the first pulse signal PUL1, may output the second pulse of the comparison signal COM as the second pulse signal PUL1, and may output the third pulse of the comparison signal COM as the third pulse signal PUL1.

The flag generator 25 may generate the first, second and third command flags CFLAG1, CFLAG2 and CFLAG3 in synchronization with the first, second and third pulse signals PUL1, PUL2 and PUL3. For example, the flag generator 25 may generate the first command flag CFLAG1 which is enabled in synchronization with a pulse of the first pulse signal PUL1 and is disabled in synchronization with a pulse of the second pulse signal PUL2. The flag generator 25 may generate the second command flag CFLAG2 which is enabled in synchronization with a pulse of the second pulse signal PUL2 and is disabled in synchronization with a pulse of the third pulse signal PUL3. The flag generator 25 may generate the third command flag CFLAG3 which is enabled in synchronization with a pulse of the third pulse signal PUL3 and is disabled in synchronization with a pulse of the first pulse signal PUL1.

Figure 3:
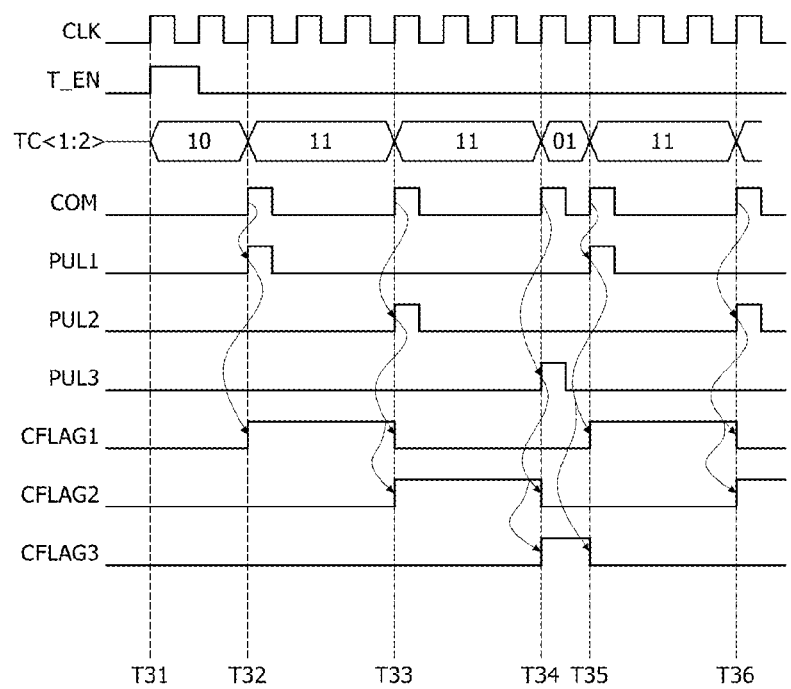
FIG. 3 is a timing diagram illustrating a representation of an example of an operation of the command flag generation circuit illustrated in FIG. 2.

An operation of the command flag generation circuit 123 having an aforementioned configuration will be described hereinafter with reference to FIG. 3. In an embodiment, it may be assumed that the first to fourth setting codes SC1<1:2>, SC2<1:2>, SC3<1:2> and SC4<1:2> have logic level combinations of '10', '11', '11' and '01', respectively.

At a point of time "T31", if the test start signal T_EN is enabled to have a logic "high" level for test of the second semiconductor device 12, the test code TC<1:2> may be counted up bit by bit from a logic level combination of '00' in synchronization with the clock signal CLK.

At a point of time "T32", if the test code TC<1:2> is counted to have a logic level combination of '10', a first pulse of the comparison signal COM may be generated and outputted as the first pulse signal PUL1 because the test code TC<1:2> has the same logic level combination as the first setting code SC1<1:2>. The first command flag CFLAG1 may be enabled to have a logic "high" level according to a pulse of the first pulse signal PUL1. A section from the point of time "T31" till the point of time "T32" may be set to be the start section corresponding to a preparation section that is necessary for enabling the first command flag CFLAG1 after the test operation commences. The test code TC<1:2> may be initialized to have a logic level combination of '00' according to the first pulse of the comparison signal COM and may be counted up bit by bit again.

At a point of time "T33", if the test code TC<1:2> is counted to have a logic level combination of '11', a second pulse of the comparison signal COM may be generated and outputted as the second pulse signal PUL2 because the test code TC<1:2> has the same logic level combination as the second setting code SC2<1:2>. The first command flag CFLAG1 may be disabled to have a logic "low" level and the second command flag CFLAG2 may be enabled to have a logic "high" level, according to a pulse of the second pulse signal PUL2. A section from the point of time "T32" till the point of time "T33" that the first command flag CFLAG1 is enabled may be set to be the first operation section in which the data patterns DQ<1:L> are written into a first memory cell array accessed by the row address patterns RADD<1:N> and the column address patterns CADD<1:M>, as described with reference to FIG. 1. The test code TC<1:2> may be initialized to have a logic level combination of '00' according to the second pulse of the comparison signal COM and may be counted up bit by bit again.

At a point of time "T34", if the test code TC<1:2> is counted to have a logic level combination of '11', a third pulse of the comparison signal COM may be generated and outputted as the third pulse signal PUL3 because the test code TC<1:2> has the same logic level combination as the third setting code SC3<1:2>. The second command flag CFLAG2 may be disabled to have a logic "low" level and the third command flag CFLAG3 may be enabled to have a logic "high" level, according to a pulse of the third pulse signal PUL3. A section from the point of time "T33" till the point of time "T34" that the second command flag CFLAG2 is enabled may be set to be the second operation section in which the data patterns DQ<1:L> stored in the first memory cell array accessed by the row address patterns RADD<1:N> and the column address patterns CADD<1:M> are read out, as described with reference to FIG. 1. The test code TC<1:2> may be initialized to have a logic level combination of '00' according to the third pulse of the comparison signal COM and may be counted up bit by bit again.

The data (ideally, the data patterns DQ<1:L>) read out of the first memory cell array in the second operation section (corresponding to the section between the point of time "T33" and the point of time "T34") may be compared with the data patterns DQ<1:L> written into the first memory cell array in the first operation section (corresponding to the section between the point of time "T32" and the point of time "T33") to generate the pass/fail information on whether the first memory cell array include at least one failed memory cell. In such an example, a compression parallel test may be used in generation of the pass/fail information.

At a point of time "T35", if the test code TC<1:2> is counted to have a logic level combination of '01', a fourth pulse of the comparison signal COM may be generated and outputted as the first pulse signal PUL1 because the test code TC<1:2> has the same logic level combination as the third setting code SC3<1:2>. The third command flag CFLAG3 may be disabled to have a logic "low" level and the first command flag CFLAG1 may be enabled to have a logic "high" level, according to a pulse of the first pulse signal PUL1. A section from the point of time "T34" till the point of time "T35" that the third command flag CFLAG3 is enabled may be set to be the third operation section in which the pass/fail information is stored in the test circuit 126, as described with reference to FIG. 1. The test code TC<1:2> may be initialized to have a logic level combination of '00' according to the fourth pulse of the comparison signal COM and may be counted up bit by bit again.

At a point of time "T36", if the test code TC<1:2> is counted to have a logic level combination of '11', a fifth pulse of the comparison signal COM may be generated and outputted as the second pulse signal PUL2 because the test code TC<1:2> has the same logic level combination as the second setting code SC2<1:2>. The first command flag CFLAG1 may be disabled to have a logic "low" level and the second command flag CFLAG2 may be enabled to have a logic "high" level, according to a pulse of the second pulse signal PUL2. A section from the point of time "T35" till the point of time "T36" that the first command flag CFLAG1 is enabled may be set to be the first operation section in which the data patterns DQ<1:L> are written into a second memory cell array accessed by the row address patterns RADD<1:N> and the column address patterns CADD<1:M>, as described with reference to FIG. 1. The test code TC<1:2> may be initialized to have a logic level combination of '00' according to the fifth pulse of the comparison signal COM and may be counted up bit by bit again.

As described above, the command flag generation circuit 123 may circularly generate the first, second and third command flags CFLAG1, CFLAG2 and CFLAG3 whose enablement sections are controlled according to predetermined logic level combinations of the first to fourth setting codes SC1<1:2>, SC2<1:2>, SC3<1:2> and SC4<1:2>. That is, the first command flag CFLAG1 enabled during the first operation section in which the write operation for storing the data patterns into a memory cell array is executed, the second command flag CFLAG2 enabled during the second operation section in which the read operation for reading out the data stored in the memory cell array is executed, and the third command flag CFLAG3 enabled during the third operation section in which the pass/fail information on the memory cell array is stored may be circularly generated to confirm whether each of memory cell arrays in the second semiconductor device 12 includes at least one failed memory cell without latency and to repair the memory cell array including the at least one failed memory cell.

Figure 4:
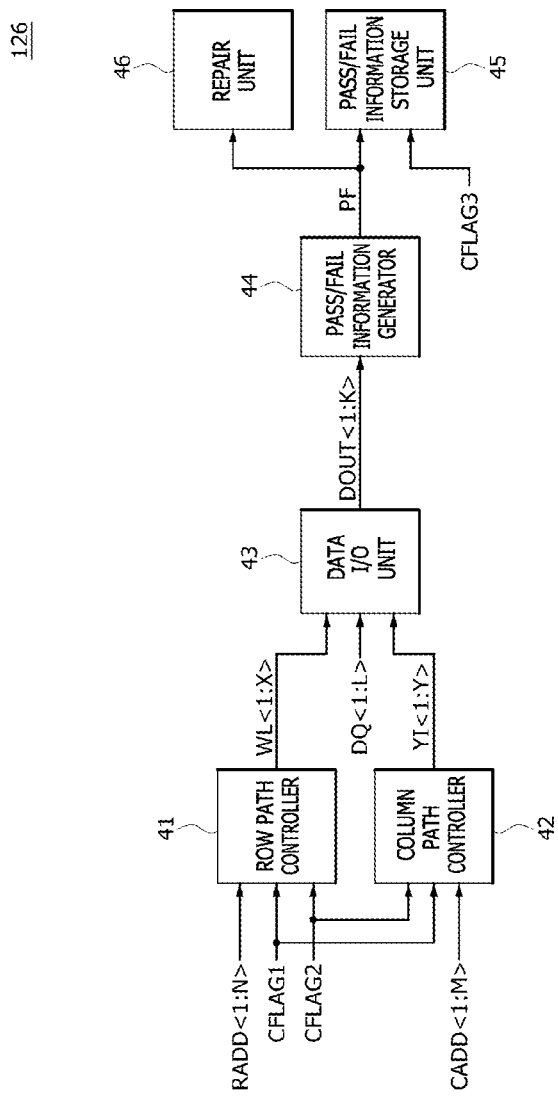
FIG. 4 is a block diagram illustrating a representation of an example of a configuration of a test circuit included in the semiconductor system of FIG. 1.

Referring to FIG. 4, the test circuit 126 may include a row path controller 41, a column path controller 42, a data input/output (I/O) unit 43, a pass/fail information generator 44, a pass/fail information storage unit 45 and a repair unit 46.

The row path controller 41 may generate word line signals WL<1:X> (i.e., X may be an integer greater than 1) in response to the first command flag CFLAG1, the second command flag CFLAG2 and the row address patterns RADD<1:N>. The row path controller 41 may decode the row address patterns RADD<1:N> to generate the word line signals WL<1:X> if the first command flag CFLAG1 or the second command flag CFLAG2 is enabled. That is, the row path controller 41 may generate the word line signals WL<1:X> for activating any one among a plurality of word lines connected to a memory cell array in order to execute a write operation during the first operation section in which the first command flag CFLAG1 is enabled or a read operation during the second operation section in which the second command flag CFLAG2 is enabled. Logic levels of the word line signals WL<1:X> generated by decoding the row address patterns RADD<1:N> and the number of bits of the word line signals WL<1:X> may be set to be different according to the embodiments.

The column path controller 42 may decode the column address patterns CADD<1:M> to generate output enablement signals YI<1:Y> (i.e., Y may be an integer greater than 1) if the first command flag CFLAG1 or the second command flag CFLAG2 is enabled. That is, the column path controller 42 may generate the output enablement signals YI<1:Y> for selectively activating one of data paths through which data are inputted or outputted during the read operation or the write operation. Logic levels of the output enablement signals YI<1:Y> generated by decoding the column address patterns CADD<1:M> and the number of bits of the output enablement signals YI<1:Y> may be set to be different according to the embodiments.

The data I/O unit 43 may receive and store the data patterns DQ<1:L> and may output the stored data patterns DQ<1:L> as output data DOUT<1:K> (i.e., K may be an integer greater than 1), in response to the word line signals WL<1:X> and the output enablement signals YI<1:Y>. The data I/O unit 43 may store the data patterns DQ<1:L> inputted through a data path activated by the output enablement signals YI<1:Y> into the memory cells connected to a word line activated by the word line signals WL<1:X> during the write operation. The data I/O unit 43 may output the data patterns DQ<1:L> stored in the memory cells connected to the word line activated by the word line signals WL<1:X> as the output data DOUT<1:K> through a data path activated by the output enablement signals YI<1:Y> during the read operation.

The pass/fail information generator 44 may generate pass/fail information PF from the output data DOUT<1:K>. The pass/fail information PF may correspond to information on whether each memory cell array in which the data patterns DQ<1:L> are written includes at least one failed memory cell. The pass/fail information generator 44 may be realized using a compression parallel test circuit and may generate the pass/fail information PF which is enabled if at least one among logic levels of the output data DOUT<1:K> is different from the others of the output data DOUT<1:K>. For example, the pass/fail information generator 44 may be realized to generate the pass/fail information PF which is enabled if at least one bit of the output data DOUT<1:K> has a logic "low" level.

The pass/fail information storage unit 45 may store the pass/fail information PF therein in response to the third command flag CFLAG3. For example, the pass/fail information storage unit 45 may store the pass/fail information PF therein if the third command flag CFLAG3 is enabled.

The repair unit 46 may repair the memory cell arrays in response to the pass/fail information PF. For example, the repair unit 46 may execute a repair operation of one or more memory cell arrays outputting the output data DOUT<1:K> if the pass/fail information PF is enabled.

Figure 5:
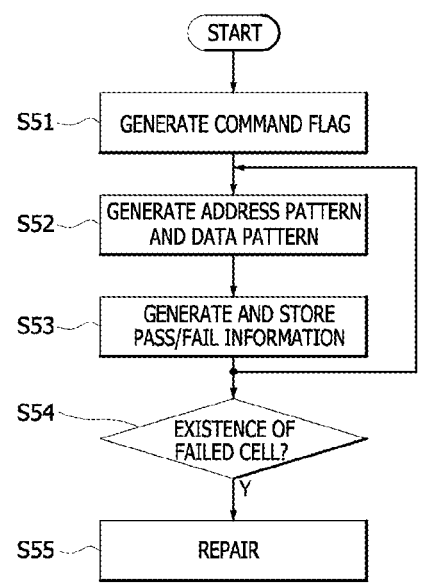
FIG. 5 is a flowchart illustrating a representation of an example of a test executed in the semiconductor system illustrated in FIGS. 1 to 4.

An operation of the semiconductor system illustrated in FIGS. 1 to 4 will be described hereinafter with reference to FIG. 5.

First, if the semiconductor system starts to operate in a test mode, an operation for generating command flags may be executed (see the step S51). That is, enablement sections of the first to third command flags CFLAG1, CFLAG2 and CFLAG3 may be set according to the second, third and fourth setting codes SC2<1:2>, SC3<1:2> and SC4<1:2> having predetermined logic level combinations. For example, if the second, third and fourth setting codes SC2<1:2>, SC3<1:2> and SC4<1:2> have the logic level combinations of '11', '11' and '01' respectively, the first operation section in which the first command flag CFLAG1 is enabled and the second operation section in which the second command flag CFLAG2 is enabled may be three times a unit section and the third operation section in which the third command flag CFLAG3 is enabled may be the unit section.

Next, address patterns and data patterns may be generated to execute the read operation and the write operation (see the step S52). For example, the row address patterns RADD<1:N>, the column address patterns CADD<1:M> and the data patterns DQ<1:L> may be generated for the write operation executed in the first operation section during which the first command flag CFLAG1 is enabled and the read operation executed in the second operation section during which the second command flag CFLAG2 is enabled.

Subsequently, the pass/fail information on whether each memory cell array has at least one failed memory cell may be generated and stored (see step the S53). The pass/fail information may be generated by writing the data patterns DQ<1:L> in the memory cell array accessed by the row address patterns RADD<1:N> and the column address patterns CADD<1:M>, by reading out the data stored in the memory cell array, and by comparing the data read out of the memory cell array with the data patterns DQ<1:L>. The pass/fail information may be stored during the third operation section in which the third command flag CFLAG3 is enabled.

Finally, the semiconductor system may discriminate whether each memory cell array has at least one failed memory cell (see the step S54), and the repair operation may be executed if at least one failed memory cell exists in the memory cell array (see the step S55).

According to the above embodiment, the first, second and third command flags CFLAG1, CFLAG2 and CFLAG3 may be sequentially and repeatedly enabled and generated. Thus, the pass/fail information on a single memory cell array may be generated and stored while the first to third command flags CFLAG1, CFLAG2 and CFLAG3 are sequentially enabled once. Accordingly, if the second semiconductor device 12 has at least two memory cell arrays, the step S52 for generating the address patterns and the data patterns and the step S53 for generating and storing the pass/fail information may be sequentially and repeatedly performed to execute the write operation and the read operation of the plurality of memory cell arrays.

As described above, a semiconductor system according to an embodiment may include a test circuit for evaluating and repairing memory cell arrays. Thus, the cost necessary for realizing a test equipment may be saved, and a plurality of semiconductor devices may be simultaneously tested. In addition, the semiconductor system according to the embodiments may circularly generate the first, second and third command flags CFLAG1, CFLAG2 and CFLAG3 whose enablement sections are controlled according to predetermined logic level combinations of the first to fourth setting codes SC1<1:2>, SC2<1:2>, SC3<1:2> and SC4<1:2> to sequentially and repeatedly set some operation sections that are necessary for testing the semiconductor devices. Thus, the test may be performed without use of latency to reduce a test time. Moreover, the semiconductor system according to the embodiment may quickly detect a failed memory cell array in the semiconductor device using address patterns and data patterns during the operation sections which are sequentially and repeatedly set and may quickly repair the failed memory cell array.

Figure 6:
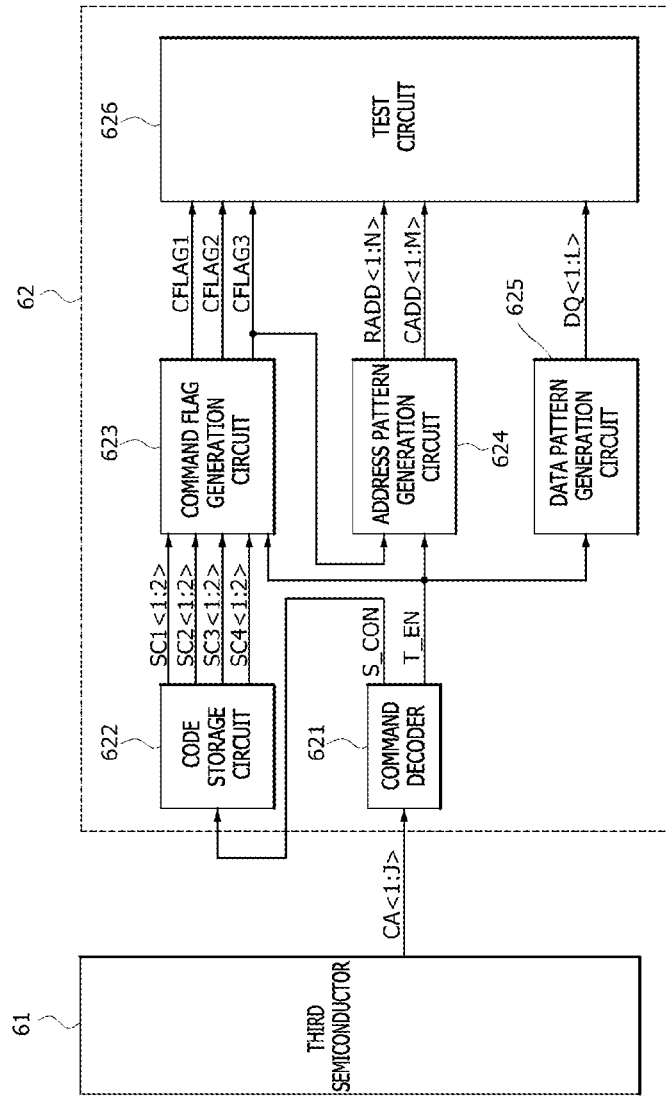
FIG. 6 is a block diagram illustrating a representation of an example of a configuration of a semiconductor system according to an embodiment.

Referring to FIG. 6, a semiconductor system according to an embodiment may include a third semiconductor device 61 and a fourth semiconductor device 62. The fourth semiconductor device 62 may include a command decoder 621, a code generation circuit 622, a command flag generation circuit 623, an address pattern generation circuit 624, a data pattern generation circuit 625, and a test circuit 626.

The third semiconductor device 61 may output command signals CA<1:J>. The command signals CA<1:J> may be set to have various logic level combinations. A test start signal T_EN or a storage control signal S_CON may be enabled according to a logic level combination of the command signals CA<1:J>. The command signals CA<1:J> may be transmitted through command lines via which only commands are transferred or through command/address lines via which both of commands and addresses are transferred. The number of bits included in the command signals CA<1:J> may be set to be different according to the embodiments.

The command decoder 621 may decode the command signals CA<1:J> to generate the test start signal T_EN and the storage control signal S_CON. The test start signal T_EN may be enabled if the command signals CA<1:J> has a first logic level combination, and the storage control signal S_CON may be enabled if the command signals CA<1:J> have a second logic level combination. If the test start signal T_EN is enabled, a test may be executed to confirm whether memory cells in a memory cell array normally operate and to repair the memory cell array when the memory cell array includes at least one failed memory cell. If the storage control signal S_CON is enabled, first to fourth setting codes SC1<1:2>, SC2<1:2>, SC3<1:2> and SC4<1:2> may be generated. Design schemes for enabling the test start signal T_EN and the storage control signal S_CON may be realized to be different according to the embodiments. For example, the test start signal T_EN and the storage control signal S_CON may be generated to have a predetermined logic level or to include a pulse at a predetermined point of time. The first and second logic level combinations may be set to be different according to the embodiments. The command decoder 621 may be realized to generate the test start signal T_EN which is enabled after the storage control signal S_CON is enabled. In such an example, the memory cell array may be evaluated and repaired after the first to fourth setting codes SC1<1:2>, SC2<1:2>, SC3<1:2> and SC4<1:2> are generated. In some embodiments, the command decoder 121 may be realized to generate the storage control signal S_CON which is enabled after the test start signal T_EN is enabled. In such an example, after a test for evaluating and repairing the memory cell array commences, the storage control signal S_CON may be enabled to generate the first to fourth setting codes SC1<1:2>, SC2<1:2>, SC3<1:2> and SC4<1:2>.

The code generation circuit 622 may generate the first to fourth setting codes SC1<1:2>, SC2<1:2>, SC3<1:2> and SC4<1:2> in response to the storage control signal S_CON. For example, if the storage control signal S_CON is enabled, the code generation circuit 622 may generate and output the first to fourth setting codes SC1<1:2>, SC2<1:2>, SC3<1:2> and SC4<1:2>. In some embodiments, the code generation circuit 622 may be realized to store predetermined first to fourth setting codes SC1<1:2>, SC2<1:2>, SC3<1:2> and SC4<1:2> therein.

The command flag generation circuit 623 may generate first to third command flags CFLAG1, CFLAG2 and CFLAG3 from the first to fourth setting codes SC1<1:2>, SC2<1:2>, SC3<1:2> and SC4<1:2> in response to the test start signal T_EN. The command flag generation circuit 623 may commence to generate the first to third command flags CFLAG1, CFLAG2 and CFLAG3 in synchronization with a point of time that a start section set by the first setting code SC1<1:2> elapses from a point of time that the test start signal T_EN is enabled. The command flag generation circuit 623 may generate the first command flag CFLAG1 which is enabled during a first operation section that is set according to the second setting code SC2<1:2>. The command flag generation circuit 623 may generate the second command flag CFLAG2 which is enabled during a second operation section that is set according to the third setting code SC3<1:2>. The command flag generation circuit 623 may generate the third command flag CFLAG3 which is enabled during a third operation section that is set according to the fourth setting code SC4<1:2>. The start section, the first operation section, the second operation section and the third operation section may be set to be different by logic level combinations of the first to fourth setting codes SC1<1:2>, SC2<1:2>, SC3<1:2> and SC4<1:2> according to the embodiments. For example, if the first, second, third and fourth setting codes SC1<1:2>, SC2<1:2>, SC3<1:2> and SC4<1:2> respectively have logic level combinations of '10', '11', '11' and '01', the start section, the first operation section, the second operation section and the third operation section may be respectively twice a unit section, three times the unit section, three times the unit section and the unit section. A fact that the first setting code SC1<1:2> has a logic level combination of '10' means that a first bit (SC1<1>) of the first setting code SC1<1:2> has a logic "low" level and a second bit (SC1<2>) of the first setting code SC1<1:2> has a logic "high" level. The unit section may be set to be different according to the embodiments. Various operations such as a read operation, a write operation, a refresh operation, a pre-charge operation, a mode register set operation, a pass/fail information storage operation and a repair operation may be executed in the first operation section, the second operation section and the third operation section. For example, the write operation may be executed in the first operation section, the read operation may be executed in the second operation section, and the pass/fail information storage operation may be executed in the third operation section. The command flag generation circuit 623 may circularly generate the first, second and third command flags CFLAG1, CFLAG2 and CFLAG3 from the second, third and fourth setting codes SC2<1:2>, SC3<1:2> and SC4<1:2>. That is, the first, second and third operation sections may be sequentially and repeatedly generated after the start section. In an embodiment, each of the first to fourth setting codes SC1<1:2>, SC2<1:2>, SC3<1:2> and SC4<1:2> may be set to have two bits, and the start section, the first operation section, the second operation section and the third operation section may be set to have the unit section, twice the unit section and three times the unit section. However, in some embodiments, each of the first to fourth setting codes SC1<1:2>, SC2<1:2>, SC3<1:2> and SC4<1:2> may be set to have N-number of bits (wherein, "N" denotes a natural number). In such an example, the start section, the first operation section, the second operation section and the third operation section may be set to have the unit section, twice the unit section, . . . and ($2^N-1$) times the unit section.

The address pattern generation circuit 624 may generate row address patterns RADD<1:N> and column address patterns CADD<1:M> in response to the test start signal T_EN and the third command flag CFLAG3. For example, if the test start signal T_EN is enabled to test the fourth semiconductor device 62, the address pattern generation circuit 624 may generate the row address patterns RADD<1:N> and the column address patterns CADD<1:M> for operations executed in the first and second operation sections. In such an example, logic level combinations of the row address patterns RADD<1:N> and the column address patterns CADD<1:M> may be set to access a predetermined memory cell or a predetermined memory cell array. The predetermined memory cell or the predetermined memory cell array accessed by the logic level combinations of the row address patterns RADD<1:N> and the column address patterns CADD<1:M> may be set to be different according to the embodiments. If an operation executed in the third operation section terminates, the address pattern generation circuit 624 may change the logic level combinations of the row address patterns RADD<1:N> and the column address patterns CADD<1:M> in synchronization with the third command flag CFLAG3 which is disabled. Thus, the memory cell or the memory cell array accessed during the first and second operation sections may be different from the memory cell or the memory cell array accessed during the previous first and second operation sections. For example, if a pass/fail information storage operation of a first memory cell array terminates in the third operation section after a write operation of the first memory cell array is executed in the first operation section and a read operation of the first memory cell array is executed in the second operation section, the write operation, the read operation and the pass/fail information storage operation of a second memory cell array may be sequentially executed after the pass/fail information storage operation of the first memory cell array terminates. In such an example, locations of the first and second memory cell arrays may be set to be different according to the embodiments. A test including the write operation, the read operation and the pass/fail information storage operation may be repeatedly performed to evaluate and repair all of the memory cell arrays included in the fourth semiconductor device 62. Alternatively, the test may be performed to selectively evaluate and repair only one or some of the memory cell arrays included in the fourth semiconductor device 62 according to the embodiments.

The data pattern generation circuit 625 may generate data patterns DQ<1:L> in response to the test start signal T_EN. For example, if the test start signal T_EN is enabled to test the fourth semiconductor device 62, the data pattern generation circuit 625 may generate the data patterns DQ<1:L>.

A logic level combination of the data patterns DQ<1:L> and the number of bits of the data patterns DQ<1:L> may be set to be different according to the embodiments. In the event that a pass/fail information storage operation of a memory cell array is executed in the third operation section after a write operation of the memory cell array is executed in the first operation section and a read operation of the memory cell array is executed in the second operation section, the data patterns DQ<1:L> may be written into the memory cell array during the write operation and the data patterns DQ<1:L> written into the memory cell array may be read out during the read operation to verify whether the memory cell array includes at least one failed memory cell.

The test circuit 626 may perform a test operation in response to the first command flag CFLAG1, the second command flag CFLAG2, the third command flag CFLAG3, the row address patterns RADD<1:N>, the column address patterns CADD<1:M> and the data patterns DQ<1:L>. The test operation executed by test circuit 626 will be described below.

The test circuit 626 may perform an operation for writing the data patterns DQ<1:L> into a first memory cell array accessed by the row address patterns RADD<1:N> and the column address patterns CADD<1:M> during the first operation section in which the first command flag CFLAG1 is enabled. The test circuit 626 may perform an operation for reading out the data stored in the first memory cell array accessed by the row address patterns RADD<1:N> and the column address patterns CADD<1:M> during the second operation section in which the second command flag CFLAG2 is enabled. In such an example, the test circuit 626 may confirm whether the data read out of the first memory cell array are consistent with the data patterns DQ<1:L> to generate the pass/fail information on the first memory cell array. In some embodiments, a compression parallel test may be used to confirm whether the data read out of the first memory cell array are consistent with the data patterns DQ<1:L>. According to the compression parallel test, data having a logic "high" level may be written into all of memory cells included in the first memory cell array and fail information may be generated if at least one datum having a logic "low" level is read out of the first memory cell array. The test circuit 626 may perform an operation for storing the pass/fail information on the first memory cell array therein during the third operation section in which the third command flag CFLAG3 is enabled. If the test operation of the first memory cell array terminates, the other memory cell arrays included in the fourth semiconductor device 62 may be sequentially tested to generate the pass/fail information on the other memory cell arrays.

As described above, the semiconductor systems illustrated in FIG. 6 may have substantially the same configuration as the semiconductor systems illustrated in FIG. 1 except the code generation circuit 622. Thus, further descriptions and operations of the semiconductor systems illustrated in FIG. 6 will be omitted.

At least one of the semiconductor devices or at least one of the semiconductor systems described with reference to FIGS. 1 to 6 may be applied to an electronic system that includes a memory system, a graphic system, a computing system, a mobile system, or the like. For example, an electronic system 1000 according an embodiment may include a data storage unit 1001, a memory controller 1002, a buffer memory 1003, and an I/O interface 1004.

The data storage unit 1001 may store data which are outputted from the memory controller 1002 or may read and output the stored data to the memory controller 1002, according to a control signal generated from the memory controller 1002. The data storage unit 1001 may include the second semiconductor device 12 illustrated in FIG. 1 or the fourth semiconductor device 62 illustrated in FIG. 6. The data storage unit 1001 may include a nonvolatile memory that can retain their stored data even when its power supply is interrupted. The nonvolatile memory may be a flash memory such as a NOR-type flash memory or a NAND-type flash memory, a phase change random access memory (PRAM), a resistive random access memory (RRAM), a spin transfer torque random access memory (STTRAM), a magnetic random access memory (MRAM), or the like.

Figure 7:
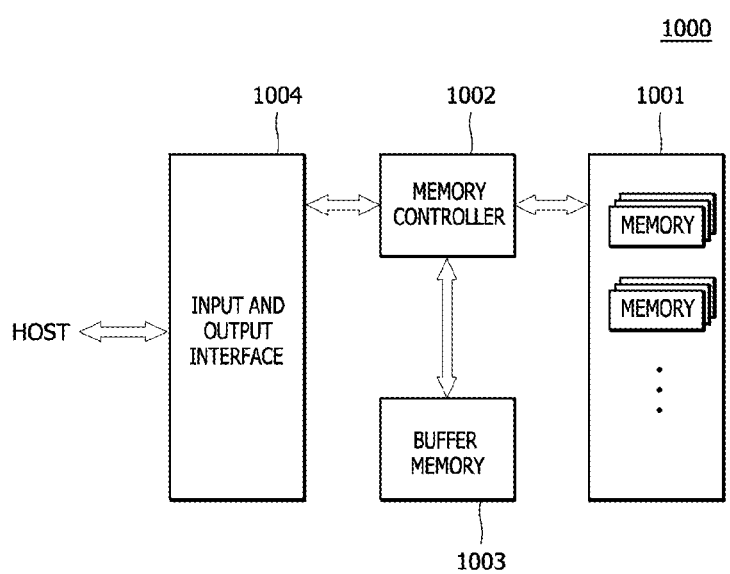
FIG. 7 is a block diagram illustrating a representation of an example of an electronic system including any one of the semiconductor systems illustrated in FIGS. 1 to 5.

The memory controller 1002 may receive a command outputted from an external device (e.g., a host device) through the I/O interface 1004 and may decode the command outputted from the host device to control an operation for inputting data into the data storage unit 1001 or the buffer memory 1003 or for outputting the data stored in the data storage unit 1001 or the buffer memory 1003. The memory controller 1002 may include the first semiconductor device 11 illustrated in FIG. 1 or the third semiconductor device 61 illustrated in FIG. 6. Although FIG. 7 illustrates the memory controller 1002 with a single block, the memory controller 1002 may include one controller for controlling the data storage unit 1001 comprised of a nonvolatile memory and another controller for controlling the buffer memory 1003 comprised of a volatile memory.

The buffer memory 1003 may temporarily store the data which are processed by the memory controller 1002. That is, the buffer memory 1003 may temporarily store the data which are outputted from or to be inputted to the data storage unit 1001. The buffer memory 1003 may store the data, which are outputted from the memory controller 1002, according to a control signal. The buffer memory 1003 may read and output the stored data to the memory controller 1002. The buffer memory 1003 may include a volatile memory such as a dynamic random access memory (DRAM), a mobile DRAM, or a static random access memory (SRAM).

The I/O interface 1004 may physically and electrically connect the memory controller 1002 to the external device (i.e., the host). Thus, the memory controller 1002 may receive control signals and data supplied from the external device (i.e., the host) through the I/O interface 1004 and may output the data generated from the memory controller 1002 to the external device (i.e., the host) through the I/O interface 1004. That is, the electronic system 1000 may communicate with the host through the I/O interface 1004. The I/O interface 1004 may include any one of various interface protocols such as a universal serial bus (USB), a multimedia card (MMC), a peripheral component interconnect-express (PCI-E), a serial attached SCSI (SAS), a serial AT attachment (SATA), a parallel AT attachment (PATA), a small computer system interface (SCSI), an enhanced small device interface (ESDI) and an integrated drive electronics (IDE).

The electronic system 1000 may be used as an auxiliary storage device of the host or an external storage device. The electronic system 1000 may include a solid state disk (SSD), a USB memory, a secure digital (SD) card, a mini secure digital (mSD) card, a micro secure digital (micro SD) card, a secure digital high capacity (SDHC) card, a memory stick card, a smart media (SM) card, a multi-media card (MMC), an embedded multi-media card (eMMC), a compact flash (CF) card, or the like.

What is claimed is:

1. A semiconductor system comprising:
a first semiconductor device configured for outputting command signals and setting signals; and a second semiconductor device configured for decoding the command signals, configured for extracting setting codes from the setting signals, and configured for testing a memory cell array accessed by address patterns during at least one operation section corresponding to the setting codes to confirm whether the memory cell array includes at least one failed memory cell, wherein the second semiconductor device includes a command flag generation circuit configured for generating the command flags and wherein the command flags are provided back to the command flag generation circuit, wherein the second semiconductor device is configured to decode the command signals to generate a storage control signal and a test start signal, wherein the second semiconductor device extracts the setting codes from the setting signals in response to the storage control signal, wherein the second semiconductor device tests the memory cell array accessed by the address patterns during the at least one operation section corresponding to the setting codes in response to the test start signal, wherein the setting codes include a first setting code, a second setting code, a third setting code and a fourth setting code; and wherein the second semiconductor device includes: a code storage circuit configured for extracting the first to fourth setting codes from the setting signals to store and output the first to fourth setting codes in response to the storage control signal; the command flag generation circuit configured for generating first to third command flags from the first to fourth setting codes in response to the test start signal; and a test circuit configured for generating and storing pass/fail information using a write operation for writing data patterns into the memory cell array accessed by row address patterns and column address patterns generated in response to the test start signal and a read operation for reading out data stored in the memory cell array.

2. The semiconductor system of claim 1, wherein the command flag generation circuit generates the first command flag which is enabled during a first operation section corresponding to the second setting code from a point of time that a start section corresponding to the first setting code terminates, generates the second command flag which is enabled during a second operation section corresponding to the third setting code from a point of time that the first operation section terminates, and generates the third command flag which is enabled during a third operation section corresponding to the fourth setting code from a point of time that the second operation section terminates.

3. The semiconductor system of claim 2, wherein the first, second and third command flags are generated to be sequentially and repeatedly enabled.

4. The semiconductor system of claim 1, wherein the command flag generation circuit includes:
a test code generator configured for generating a test code that is counted in synchronization with a clock signal in response to the test start signal;
a code selector configured for selecting and outputting one of the first to fourth setting codes as a selection code in response to the test start signal and the first to third command flags;
a code comparator configured for comparing the selection code with the test code to generate a comparison signal;

a pulse distributor configured for distributing pulses of the comparison signal into first to third pulse signals and configured for sequentially outputting the first to third pulse signals; and a flag generator configured for generating the first, second and third command flags in response to the first, second and third pulse signals.

5. The semiconductor system of claim 4, wherein the test code is reset whenever the pulses of the comparison signal are generated.

6. The semiconductor system of claim 4, wherein the code selector selects and outputs the first setting code as the selection code if the test start signal is enabled, selects and outputs the second setting code as the selection code if the first command flag is enabled, selects and outputs the third setting code as the selection code if the second command flag is enabled, and selects and outputs the fourth setting code as the selection code if the third command flag is enabled.

7. The semiconductor system of claim 4, wherein the code comparator generates a pulse of the comparison signal if the selection code is equal to the test code.

8. The semiconductor system of claim 4, wherein the first command flag is enabled in response to a pulse of the first pulse signal and is disabled in response to a pulse of the second pulse signal.

9. The semiconductor system of claim 1, wherein the test circuit repairs the memory cell array if the memory cell array includes at least one failed memory cell.

10. The semiconductor system of claim 1, wherein the test circuit includes:
a data I/O unit configured for receiving and writing the data patterns into the memory cell array during a first operation section in which the first command flag is enabled and configured for outputting data stored in the memory cell array as output data during a second operation section in which the second command flag is enabled;
a pass/fail information generator configured for extracting the pass/fail information from the output data and configured for outputting the pass/fail information;
a pass/fail information storage unit configured for storing the pass/fail information during a third operation section in which the third command flag is enabled; and
a repair unit configured for repairing the memory cell array according to the pass/fail information.

11. A semiconductor system comprising:
a first semiconductor device configured for outputting command signals; and
a second semiconductor device configured for decoding the command signals, configured for generating setting codes, and configured for testing a memory cell array accessed by address patterns during at least one operation section corresponding to the setting codes to confirm whether the memory cell array includes at least one failed memory cell, wherein the second semiconductor device includes a command flag generation circuit configured for generating the command flags and wherein the command flags are provided back to the command flag generation circuit, wherein the second semiconductor device is configured to decode the command signals to generate a storage control signal and a test start signal, wherein the second semiconductor device generates the setting codes in response to the storage control signal, wherein the second semiconductor device tests the memory cell array accessed by the address patterns during the at least one operation section corresponding to the setting codes in response to the test start signal, wherein the setting codes includes a first setting code, a second setting code, a third setting code and a fourth setting code; and wherein the second semiconductor device includes: a code generation circuit configured for generating and outputting the first to fourth setting codes in response to the storage control signal; the command flag generation circuit configured for generating first to third command flags from the first to fourth setting codes in response to the test start signal; and a test circuit configured for generating and storing pass/fail information using a write operation for writing data patterns into the memory cell array accessed by row address patterns and column address patterns generated in response to the test start signal and a read operation for reading out data stored in the memory cell array.

12. A semiconductor device comprising:
a command flag generation circuit configured for generating a first command flag which is enabled during a first operation section corresponding to a second setting code from a point of time that a start section corresponding to a first setting code terminates, configured for generating a second command flag which is enabled during a second operation section corresponding to a third setting code from a point of time that the first operation section terminates, and configured for generating a third command flag which is enabled during a third operation section corresponding to a fourth setting code from a point of time that the second operation section terminates; and
a test circuit configured for generating and storing pass/fail information using a write operation for writing data patterns into a memory cell array accessed by row address patterns and column address patterns generated in response to a test start signal and a read operation for reading data stored in the memory cell array, wherein the first to third command flags are provided back to the command flag generation circuit, wherein the test circuit includes: a data I/O unit configured for receiving and writing the data patterns into the memory cell array during the first operation section in which the first command flag is enabled and configured for outputting data stored in the memory cell array as output data during the second operation section in which the second command flag is enabled; a pass/fail information generator configured for extracting the pass/fail information from the output data and configured for outputting the pass/fail information; a pass/fail information storage unit configured for storing the pass/fail information during the third operation section in which the third command flag is enabled; and a repair unit configured for repairing the memory cell array according to the pass/fail information.

13. The semiconductor device of claim 12, wherein the first, second and third command flags are generated to be sequentially and repeatedly enabled.

14. The semiconductor device of claim 12, wherein the command flag generation circuit includes:
a test code generator configured for generating a test code that is counted in synchronization with a clock signal in response to the test start signal;
a code selector configured for selecting and outputting one of the first to fourth setting codes as a selection code in response to the test start signal and the first to third command flags;

a code comparator configured for comparing the selection code with the test code to generate a comparison signal;
a pulse distributor configured for distributing pulses of the comparison signal into first to third pulse signals and configured for sequentially outputting the first to third pulse signals; and
a flag generator configured for generating the first, second and third command flags in response to the first, second and third pulse signals.

15. The semiconductor device of claim 14, wherein the test code is reset whenever the pulses of the comparison signal are generated.

16. The semiconductor device of claim 14, wherein the code selector selects and outputs the first setting code as the selection code if the test start signal is enabled, selects and outputs the second setting code as the selection code if the first command flag is enabled, selects and outputs the third setting code as the selection code if the second command flag is enabled, and selects and outputs the fourth setting code as the selection code if the third command flag is enabled.

17. The semiconductor device of claim 14, wherein the code comparator generates a pulse of the comparison signal if the selection code is equal to the test code.

18. The semiconductor device of claim 14, wherein the first command flag is enabled in response to a pulse of the first pulse signal and is disabled in response to a pulse of the second pulse signal.

19. The semiconductor device of claim 12, wherein the test circuit repairs the memory cell array if the memory cell array includes at least one failed memory cell.

\* \* \* \* \*